(12) United States Patent
Murao

(10) Patent No.: US 11,480,604 B2
(45) Date of Patent: Oct. 25, 2022

(54) HIGH-FREQUENCY METHOD AND APPARATUS FOR MEASURING AN AMPLIFIER

(71) Applicant: NEC CORPORATION, Tokyo (JP)

(72) Inventor: Yoji Murao, Tokyo (JP)

(73) Assignee: NEC CORPORATION, Tokyo (JP)

( * ) Notice: Subject to any disclaimer, the term of this patent is extended or adjusted under 35 U.S.C. 154(b) by 592 days.

(21) Appl. No.: 16/484,333

(22) PCT Filed: Nov. 20, 2017

(86) PCT No.: PCT/JP2017/041675
§ 371 (c)(1),
(2) Date: Aug. 7, 2019

(87) PCT Pub. No.: WO2018/146901
PCT Pub. Date: Aug. 16, 2018

(65) Prior Publication Data
US 2019/0369158 A1    Dec. 5, 2019

(30) Foreign Application Priority Data

Feb. 8, 2017    (JP) .............................. JP2017-021155

(51) Int. Cl.
G01R 31/26    (2020.01)
H04B 17/15    (2015.01)
H03F 3/193    (2006.01)

(52) U.S. Cl.
CPC ......... *G01R 31/2639* (2013.01); *H03F 3/193* (2013.01); *H04B 17/15* (2015.01)

(58) Field of Classification Search
CPC ................ G01R 27/32; G01R 31/2621; G01R 31/2639; G01R 31/2822; G01R 31/2837;
(Continued)

(56) References Cited

U.S. PATENT DOCUMENTS 2,929,989 A * 3/1960 Hurvitz ................. G01R 23/20
324/624
6,160,773 A * 12/2000 Maegawa ............ G11B 7/0901
(Continued)

FOREIGN PATENT DOCUMENTS

EP    1643636 A1    4/2006
JP    5-196687 A    8/1993
(Continued)

OTHER PUBLICATIONS

Communication dated Oct. 6, 2020, issued by the Japanese Patent Office in application No. 2018-566764.
(Continued)

*Primary Examiner* — Vinh P Nguyen
(74) *Attorney, Agent, or Firm* — Sughrue Mion, PLLC

(57) ABSTRACT

A high-frequency 5 measurement method includes generating a test signal (TS), which is a sine-wave signal having a predetermined frequency, in which a period (τ) during which the power level is at a first power level and a period (T-τ) during which the power level is at a second power level lower than the first power level 10 are periodically repeated,
(Continued)

inputting the test signal (TS) to a device under test (10) as an input signal, and measuring the difference between an output signal (OUT) of the device under test (10) and an ideal value of the output signal (OUT).

7 Claims, 6 Drawing Sheets

(58) Field of Classification Search
CPC ..... G01R 31/2841; H03F 3/189; H03F 3/193; H04B 17/15
See application file for complete search history.

(56) References Cited

U.S. PATENT DOCUMENTS

| | | | | |
|---|---|---|---|---|
| 6,806,772 B2* | 10/2004 | Glaser | ............ | H03F 1/30 |
| | | | | 330/289 |
| 7,810,057 B2* | 10/2010 | Eckl | ............ | H03F 1/32 |
| | | | | 716/136 |
| 8,704,533 B2* | 4/2014 | Quan | ............ | G01R 31/2825 |
| | | | | 324/621 |
| 9,386,385 B2* | 7/2016 | Quan | ............ | G01R 23/20 |
| 2006/0066394 A1 | 3/2006 | Eckl et al. | | |
| 2014/0187182 A1 | 7/2014 | Yan et al. | | |

FOREIGN PATENT DOCUMENTS

| | | |
|---|---|---|
| JP | 5-206744 A | 8/1993 |
| JP | 2016-57091 A | 4/2016 |
| WO | 2013/133170 A1 | 9/2013 |

OTHER PUBLICATIONS

International Search Report for PCT/JP2017/041675 dated Feb. 13, 2018 [PCT/ISA/210].

Communication dated Jan. 14, 2020 from the European Patent Office in application No. 17895625.6.

Gou, Y., et al., "Extraction and Validation of Power Amplifiers' Harmonics Dynamic X-Parameters From Pulsed Envelope Domain Measurements", IEEE Transaction on Microwave Theory and Techniques, vol. 62, No. 12, Dec. 2014, pp. 2900-2910.

Draxler, P., et al., "Time Domain Characterization of Power Amplifiers with Memory Effects", IEEE MTT-S International Microwave Symposium Digest, vol. 2, 2003, pp. 803-806.

\* cited by examiner

HIGH-FREQUENCY METHOD AND APPARATUS FOR MEASURING AN AMPLIFIER

CROSS REFERENCE TO RELATED APPLICATIONS

This application is a National Stage of International Application No. PCT/JP2017/041675, filed on Nov. 20, 2017, which claims priority from Japanese Patent Application No. 2017-02115, filed on Feb. 8, 2017, the contents of all of which are incorporated herein by reference in their entirety.

TECHNICAL FIELD

The present invention relates to a high-frequency measurement method and a high-frequency measurement apparatus, and relates to, for example, a high-frequency measurement method and a high-frequency measurement apparatus for measuring an amplifier that amplifies a high-frequency signal.

BACKGROUND ART

In a mobile broadband communication represented by mobile phones, it is required to transmit a broadband signal with the bandwidth of a few MHz to tens of MHz having a large peak-to-average power ratio (PAPR) with low distortion. Especially with regard to a downlink signal to be sent from a base station, an amplifier is generally operated at a possible highest level using a distortion compensation function, such as digital predistortion, while back-off corresponding to the signal PAPR is secured, in order to reduce the power consumption of a transmission amplifier while the adjacent channel leakage ratio defined in the 3GPP standards is satisfied.

For recent amplifiers, transistors using a compound semiconductor (for, example, gallium nitride (GaN)) that achieves miniaturization and high efficiency as amplifying elements have been used. It is known that current collapse occurs when a high electric field is applied to a GaN transistor. In current collapse, charges are trapped in the surface of or inside the semiconductor, and the current lowers. Current collapse has a time response in which the current collapse is recovered over time. Such a time response means that the operation point of a transistor changes over time, and the characteristics of an amplifier, such as the power gain or nonlinearity, vary over time when the transistor is used for the amplifier. This variation continues for hundreds of nanoseconds to seconds.

On the other hand, digital predistortion operates at a speed from tens of nanoseconds to microseconds in order to monitor a band which is several times wider than a signal band. This time has an equivalent order of the recovery time of current collapse, and this means that the characteristics of the amplifier vary every moment while the digital predistortion is operated. In addition, the variation amount of the amplifier characteristics due to current collapse varies depending on an applied high-electric field and time, and is not uniform. As a result, the digital predistortion cannot follow, and the distortion compensation function can be degraded. Since the amount of current collapse occurring when a high-electric field is applied to a transistor and the variation of the amplifier performance due to the current collapse vary depending on individual transistors, it is possible to evaluate the compatibility with digital predistortion if the variation amount is measured.

Patent Literature 1 discloses an example of a semiconductor inspection apparatus that evaluates current collapse. The semiconductor inspection apparatus disclosed in Patent Literature 1 includes a first detecting unit electrically connected to a source electrode of a field-effect transistor, a first diode including a first cathode electrode electrically connected to a drain electrode of the field-effect transistor, a second detecting unit electrically connected to a first anode electrode of the first diode, a first resistance element having one end connected to the first anode electrode, and a first electric power source connected to the other end of the first resistance element.

CITATION LIST

Patent Literature

Patent Literature 1: Japanese Unexamined Patent Application Publication No. 2016-57091

SUMMARY OF INVENTION

Technical Problem

However, since the semiconductor inspection apparatus disclosed in Patent Literature 1 supplies a direct-current signal to a field-effect transistor, which is a device under test, it is difficult to accurately grasp variation in high-frequency performance when a high-frequency signal is input to an amplifier.

Solution to Problem

One aspect of a high-frequency measurement method according to the present invention is a high-frequency measurement method for measuring an amplifier or a semiconductor amplifying element as a device under test, the high-frequency measurement method including generating a test signal, the test signal being a sine-wave signal having a predetermined frequency, in which a period during which a power level is at a first power level and a period during which the power level is at a second power level lower than the first power level are periodically repeated, inputting the test signal to the device under test as an input signal, and measuring a difference between an output signal of the device under test and an ideal value of the output signal.

Another aspect of the high-frequency measurement method according to the present invention is a high-frequency measurement method for measuring a compound semiconductor transistor as a device under test, the high-frequency measurement method including generating a test signal, the test signal being a sine-wave signal having a predetermined frequency, in which a period during which a power level is at a first power level and a period during which the power level is at a second power level lower than the first power level are periodically repeated, inputting the test signal to the device under test as an input signal, and measuring, based on an output signal of the device under test, a transient response in gain variation of the device under test.

One aspect of a high-frequency measurement apparatus according to the present invention includes a signal generator that outputs a test signal, the test signal being a sine-wave signal having a predetermined frequency, in which a period during which a power level is at a first power level and a period during which the power level is at a second power level lower than the first power level are periodically repeated, and a measuring instrument that measures a difference between an output signal of a device under test and an ideal value of the output signal.

Advantageous Effects of Invention

With a high-frequency measurement method and a high-frequency measurement apparatus according to the present invention, it is possible to accurately grasp variation in high-frequency performance when a high-frequency signal is input to an amplifier.

DESCRIPTION OF EXAMPLE EMBODIMENTS

First Example Embodiment

Figure 1:
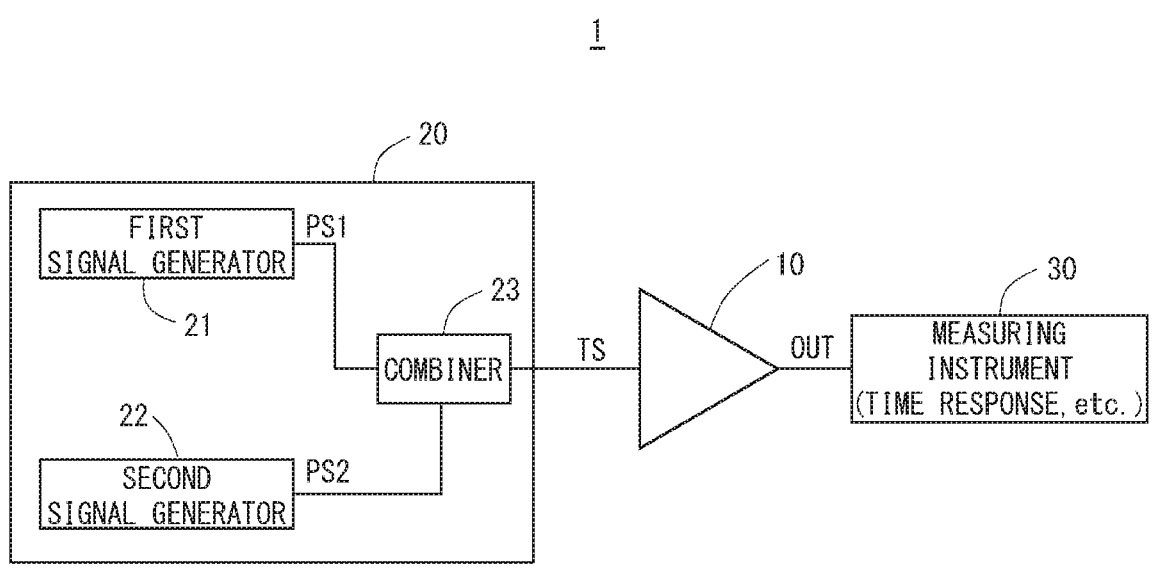
FIG. 1 is a block diagram showing a high-frequency measurement apparatus according to a first example embodiment.

Hereinafter, example embodiments of the present invention are described with reference to the drawings. For the sake of clarify, the following descriptions and drawings are omitted and simplified as appropriate. In the drawings, the same elements are denoted by the same reference signs, and duplicated descriptions are omitted as necessary.

First, a high-frequency measurement apparatus 1 according to a first example embodiment measures, for example, a compound semiconductor transistor, such as gallium nitride (GaN) transistor, or an amplifier including a compound semiconductor transistor as a device under test.

FIG. 1 is a block diagram showing the high-frequency measurement apparatus 1 according to the first example embodiment. As shown in FIG. 1, the high-frequency measurement apparatus 1 according to the first example embodiment measures a device under test 10. The high-frequency measurement apparatus 1 according to the first example embodiment includes a signal generator 20 and a measuring instrument 30.

The signal generator 20 generates a test signal TS, which is a sine-wave signal having a predetermined frequency, in which a period during which a power level is at a first power level and a period during which the power level is at a second power level lower than the first power level are periodically repeated. The signal generator 20 includes, as an example, a first signal generator 21, a second signal generator 22, and a combiner 23.

The first signal generator 21 outputs a first sine-wave signal PS1 having the first power level. The second signal generator 22 outputs a second sine-wave signal PS2 having the second power level. The combiner 23 combines the first sine-wave signal PS1 and the second sine-wave signal PS2 to output the test signal TS. Note that, in the case of considering the power loss at the combiner 23, the power levels of the first sine-wave signal PS1 output from the first signal generator 21 and of the second sine-wave signal output from the second signal generator 22 are assumed to be suitable power levels considering the power loss.

The measuring instrument 30 measures the difference between an output signal OUT of the device under test 10 and an ideal value of the output signal OUT. Specifically, the measuring instrument 30 measures the difference between the output signal OUT relating to a time response or frequency response of the output signal OUT and the ideal value. The time response of the output signal OUT can be a transient response of the power waveform of the output signal OUT, a signal distortion of the output signal OUT, a transmission delay, or the like. The frequency response of the output signal OUT can be a phase rotation amount of the output signal OUT, or the like. In the following, the high-frequency measurement apparatus 1 is described on the assumption that the measuring instrument 30 measures a transient response of the power waveform of the output signal OUT.

Figure 2:
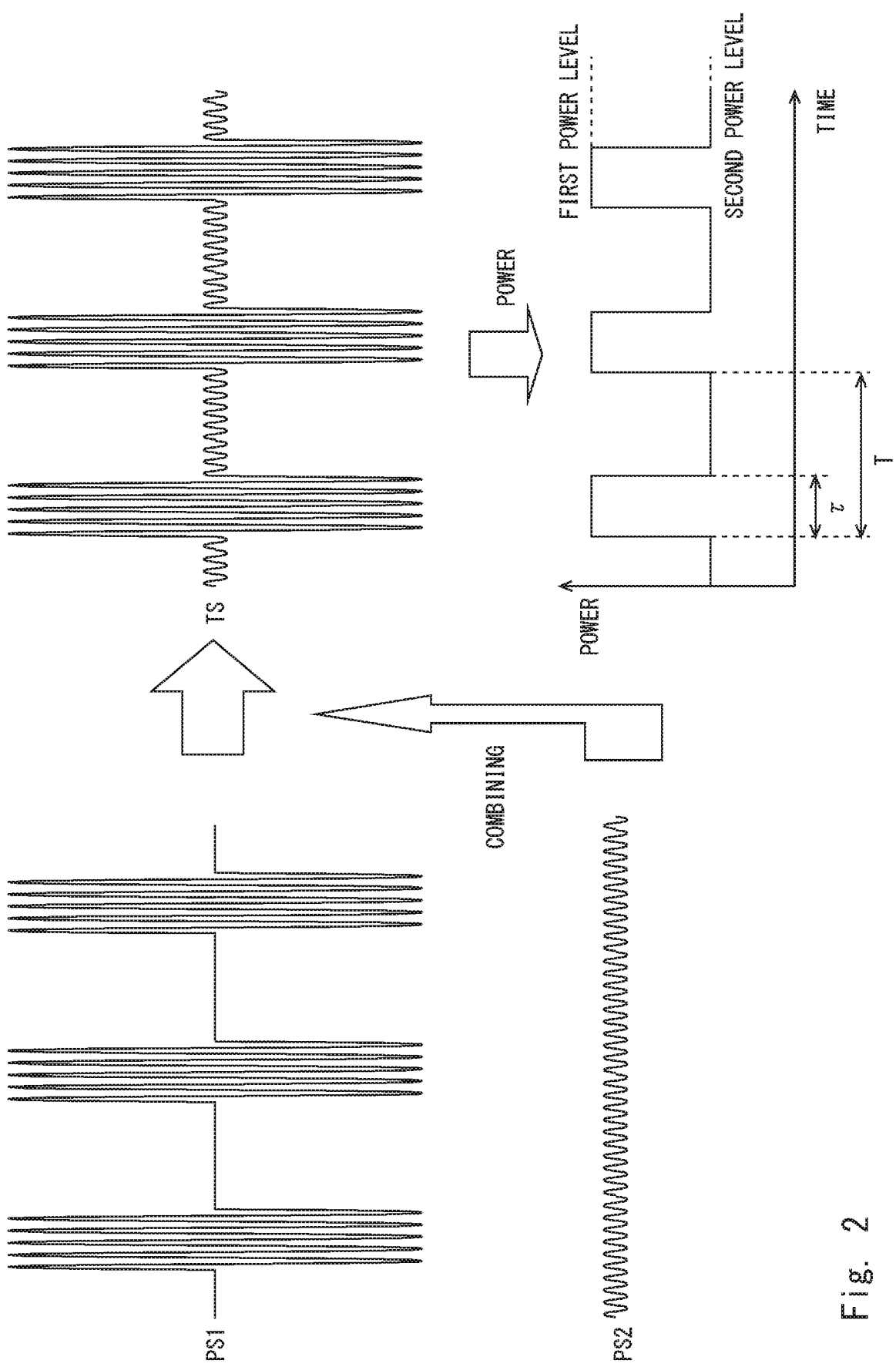
FIG. 2 is a diagram explaining a test signal of the high-frequency measurement apparatus according to the first example embodiment.

Next, an operation of the high-frequency measurement apparatus 1 according to the first example embodiment is described. First, the test signal TS is described. FIG. 2 is a diagram explaining a test signal of the high-frequency measurement apparatus according to the first example embodiment.

As shown in FIG. 2, the test signal TS is generated by combining the first sine-wave signal PS1 and the second sine-wave signal PS2. The first sine-wave signal PS1 is a signal in which a period having a sine wave at the first power level and a period having no signal are repeated in a cycle T. In the first sine-wave signal PS1, a period τ having the sine wave is about from tens of nanoseconds to milliseconds that is a time having an equivalent order to that of the sampling interval or the signal frame length of a modulated wave signal used by mobile phone base stations or the like. In addition, the frequency of the sine wave of the first sine-wave signal PS1 is about from 800 MHz to 3.5 GHz that is a carrier frequency of a signal used by mobile phone base stations or the like, or is a higher frequency including a millimeter wave band. The second sine-wave signal PS2 is a signal having a continuous sine wave at the second power level. Note that, the second power level is significantly small power compared to the first power level and is assumed to have the power difference that can be approximated as the first power level in the period having two sine waves when the first sine-wave signal PS1 and the second sine-wave signal PS2 are combined.

By combining the first sine-wave signal PS1 and the second sine-wave signal PS2, it is possible to generate the test signal TS in which the period T-τ during which the power level is at the first power level, the period T-τ after period τ passes during which the power level is at the second power level, and the first-power-level period and the second-power-level period are repeated in the cycle T. FIG. 2 also shows a graph showing the test signal TS expressed by the power level.

In addition, the length of the period T-τ is preferably set to the length of time required to observe the recovery of current collapse having occurred in the device under test 10, and is, for example, about from hundreds of nanoseconds to seconds.

Figure 3:
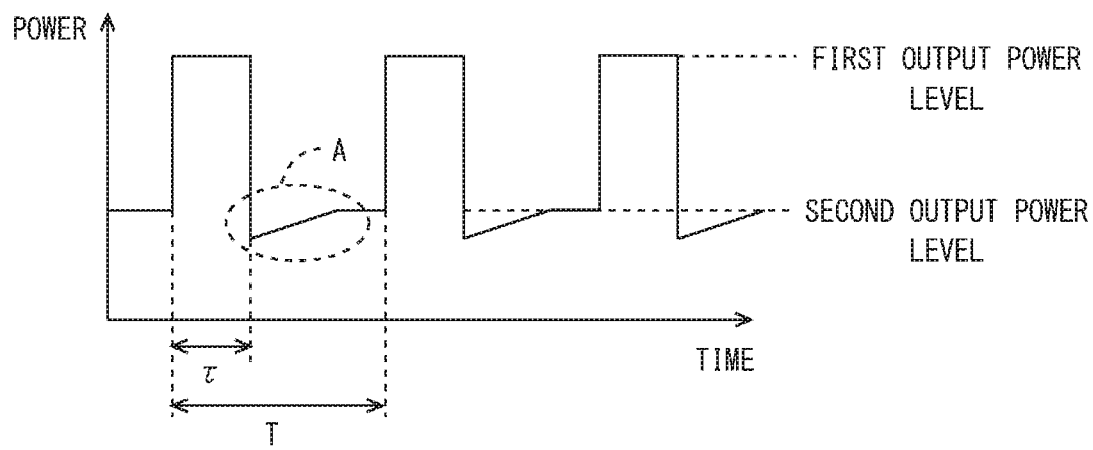
FIG. 3 is a diagram explaining a time response of an output signal of a device under test measured by the high-frequency measurement apparatus according to the first example embodiment.
Figure 3:
Figure 3:
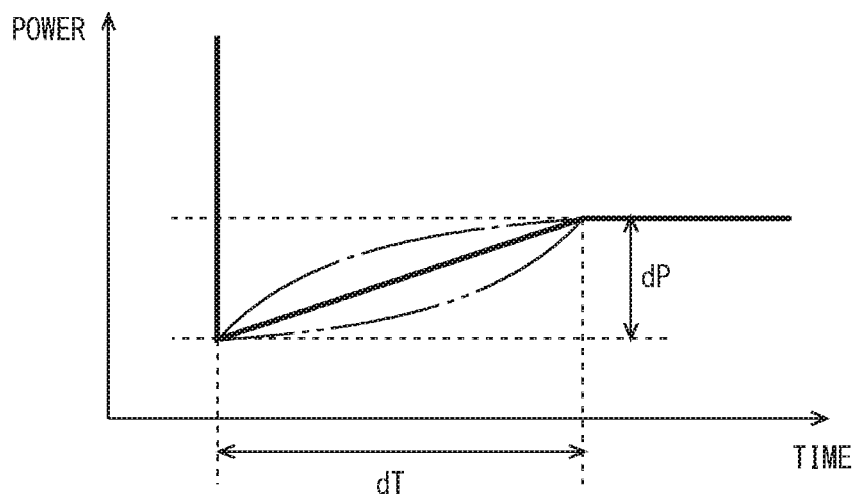

When the test signal TS shown in FIG. 2 is input to an amplifier or a semiconductor amplifying element, which is the device under test 10, current collapse is induced in the device under test 10 in the first-power-level period. Then, immediately after the power level of the test signal TS reaches the second power level, the current collapse recovers gradually. Thus, a time response of the output signal OUT of the device under test 10 when current collapse occurs and recovers is described. FIG. 3 shows a diagram explaining a time response of an output signal of a device under test measured by the high-frequency measurement apparatus according to the first example embodiment. In FIG. 3, a first output power level is the power output from the device under test 10 when the input signal level is at the first power level shown in FIG. 2. In FIG. 3, a second output power level is the power output from the device under test 10 when the input signal level is at the second power level shown in FIG. 2 and when current collapse does not occur in the device under test 10.

As shown in FIG. 3, in the power waveform of the output signal OUT obtained by input the test signal TS to the device under test 10 measured by the high-frequency measurement apparatus 1 according to the first example embodiment, the power of the output signal OUT becomes lower than the second output power level when the power level of the input signal is changed from the first power level to the second power level, and, then, gradually returns to the second output power level. The reference "A" in FIG. 3 shows the waveform while current collapse is recovering.

The lower part of FIG. 3 shows the enlarged power waveform of the output signal OUT during the period A. As shown in the lower part of FIG. 3, the change in the power waveform due to the recovery of the current collapse can be expressed by a time dT and a power difference dP. The measuring instrument 30 measures the time dT and the power difference dP. The measuring instrument 30 can use three measurement methods. A first measurement method is to measure the time dT until the power level of the output signal OUT returns the second output power level and a change amount dP of the power level of the output signal OUT. A second measurement method is to measure the time dT until the power level of the output signal OUT reaches a certain change amount dP. A third measurement method is to measure a change amount dP of the power level of the output signal OUT at a time when a certain time dT passes since the input signal is changed from the first power level to the second power level.

Note that, the power waveform of the output signal OUT when current collapse is recovered is not limited to a linear change (the solid line in FIG. 3), and can be a nonlinear change as shown by the dashed-and-dotted line or the dashed-and-double-dotted line in FIG. 3, or an undulating change.

As described above, in the high-frequency measurement apparatus 1 and the high-frequency measurement method according to the first example embodiment, the test signal TS simulating a signal to be input when the device under test 10 is actually operated is generated, and the gain variation of the device under test 10 due to current collapse is measured based on the test signal TS. Thus, with the high-frequency measurement apparatus 1 and the high-frequency measurement method according to the first example embodiment, it is possible to perform quantitative evaluation of current collapse in the device under test 10 with high accuracy.

In addition, the influence of current collapse differs depending on the magnitude and time of a high-electric field applied to the device under test 10. Thus, by adjusting the first power level and the time τ so as to meet the operating conditions, it is possible for the high-frequency measurement apparatus 1 according to the first example embodiment to measure and evaluate the influence on amplifier characteristics due to current collapse during the operating state.

Furthermore, it is known that phase characteristics, delay characteristics, or distortion characteristics are changed in current collapse. With regard to these characteristics, by changing items to be measured by the measuring instrument 30, it is possible for the high-frequency measurement apparatus 1 according to the first example embodiment to measure and evaluate the change in these characteristics in a state close to the operating state.

Note that, the above description has been made on the assumption of current collapse in a GaN semiconductor in which charges are trapped by a high-electric field, but the measurement method according to the present invention is applicable to, for example, measurement or evaluation of the influence of a phenomenon called drain lag or gate lag in other semiconductor materials, such as GaAs, on high-frequency characteristics.

Second Example Embodiment

Figure 4:
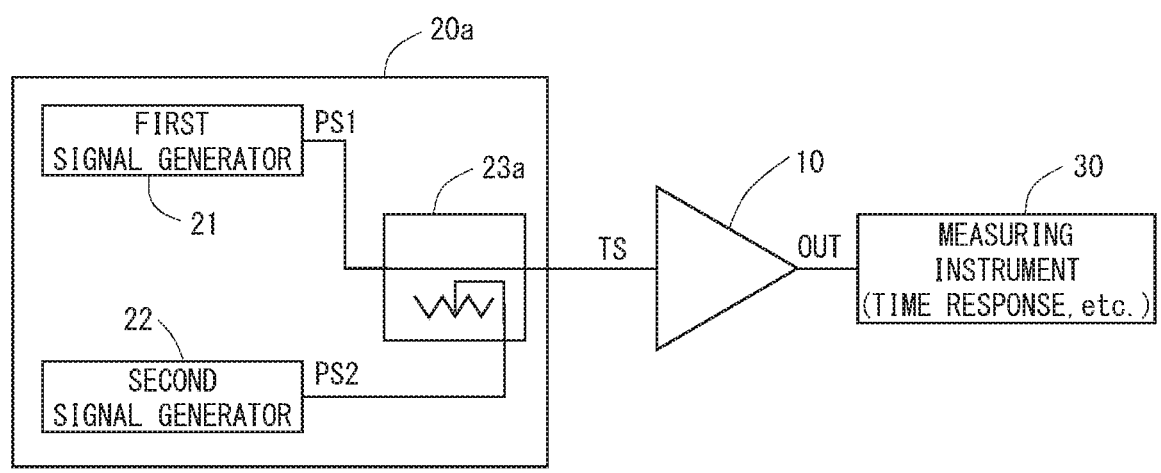
FIG. 4 is a block diagram showing a high-frequency measurement apparatus according to a second example embodiment.

In a second example embodiment, a combiner 23a, which is a specific example of the combiner 23, is described. FIG. 4 is a block diagram showing a high-frequency measurement apparatus 2 according to the second example embodiment. As shown in FIG. 4, the combiner 23a is a directional coupler. The combiner 23a transmits a first sine-wave signal PS1 through an input/output path and inputs a second sine-wave signal PS2 to a coupling terminal.

In the relationship between the first power level and the second power level, the first power level is larger than the second power level. Thus, by transmitting the first sine-wave signal PS1 using an input/output path having low transmission loss at the directional coupler, it is possible to easily achieve a time response shown in FIG. 2. In addition, the difference between the first power level and the second power level can be about 20 dB to 30 dB, and it is also possible to achieve such the level difference with the coupling amount of the directional coupler.

Third Example Embodiment

Figure 5:
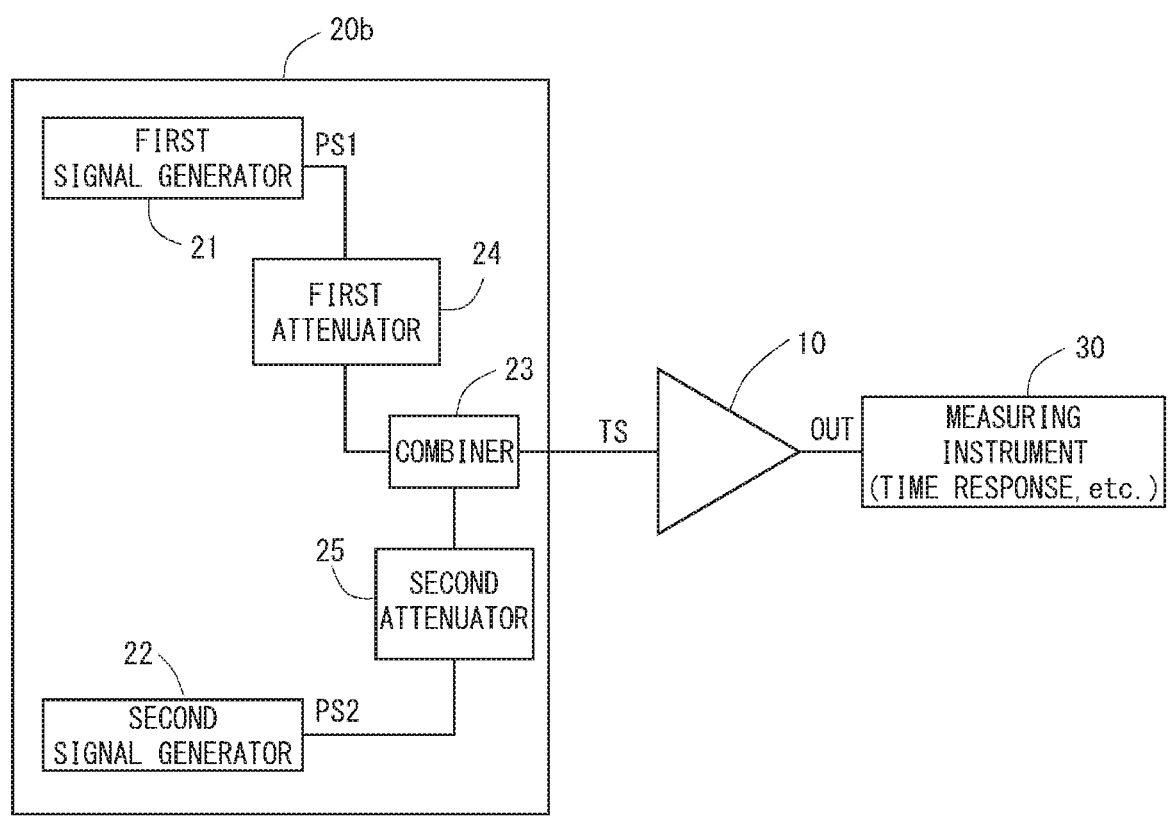
FIG. 5 is a block diagram showing a high-frequency measurement apparatus according to a third example embodiment.

In a third example embodiment, a signal generator 20b, which is a different example embodiment from the signal generator 20, is described. FIG. 5 is a block diagram showing a high-frequency measurement apparatus 3 according to the third example embodiment. As shown in FIG. 5, the signal generator 20b is configured by adding a first attenuator 24 and a second attenuator 25 to the signal generator 20.

The first attenuator 24 is provided between a first signal generator 21 and a combiner 23. The first attenuator 24 adjusts the amplitude of a first sine-wave signal PS1. The second attenuator 25 is provided between a second signal generator 22 and the combiner 23. The second attenuator 25 adjusts the amplitude of a second sine-wave signal PS2.

Since current collapse depends on the magnitude and time of an electric field to be applied, a device under test under various conditions can be measured as long as the first power level is varied. Furthermore, the first power level is required to be sufficiently high to drive the device under test in a nonlinear region in which the power gain of the device under test is suppressed compared to the linear gain. Thus, by adjusting the first power level with the first attenuator 24, it is possible to easily adjust a higher power level required for any amplifier. Moreover, the characteristic after current collapse occurs, that is, the response in the period A shown in FIG. 3 depends on the second power level. For these reasons, by varying the second power level with the second attenuator 25, it is possible to measure the behavior of the device under test 10 under various conditions.

Fourth Example Embodiment

Figure 6:
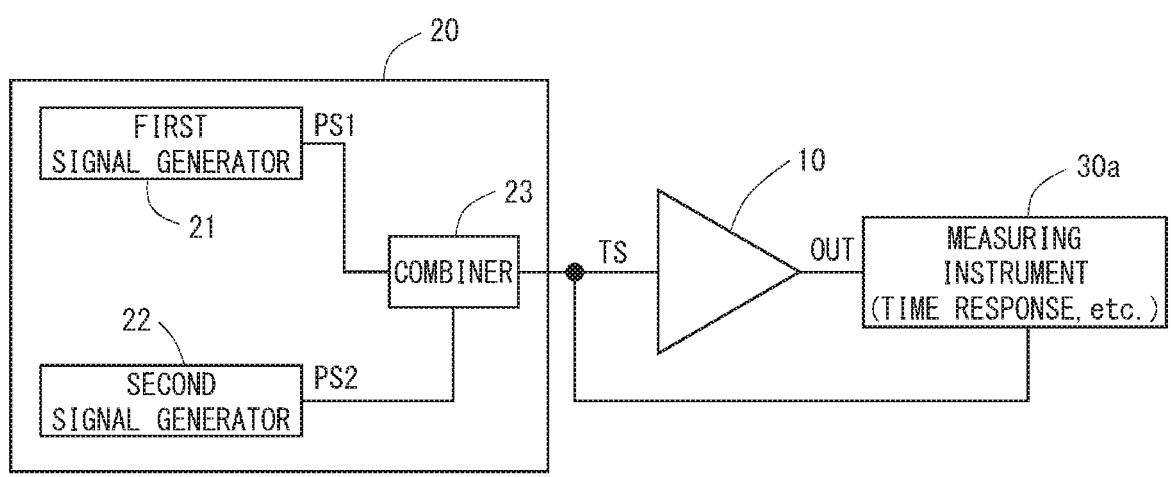
FIG. 6 is a block diagram showing a high-frequency measurement apparatus according to a fourth example embodiment.

In a fourth example embodiment, a high-frequency measurement apparatus 4, which is a different example embodiment of the high-frequency measurement apparatus 1, is described. FIG. 6 is a block diagram showing a high-frequency measurement apparatus 4 according to the fourth example embodiment. As shown in FIG. 6, the high-frequency measurement apparatus 4 according to the fourth example embodiment includes a measuring instrument 30a instead of the measuring instrument 30.

The measuring instrument 30a uses a test signal TS, which is an input signal of the device under test 10, as a waveform of an ideal value of an output signal OUT. By generating the ideal value of the output signal OUT using a signal to be input to the device under test 10, it is possible to shorten the measuring time without setting an ideal value depending on a change in the conditions of the test signal TS.

The present invention has been described with the above example embodiments, but is not limited by the above example embodiments. Various modifications that can be understood by those skilled in the art can be made to the configurations and the details of the present invention without departing from the scope of the invention.

REFERENCE SIGNS LIST

1 High-frequency measurement apparatus
2 High-frequency measurement apparatus
3 High-frequency measurement apparatus
4 High-frequency measurement apparatus
10 Device under test
20 Signal generator
21 First signal generator
22 Second signal generator
23 Combiner
24 First attenuator
25 Second attenuator
30 Measuring instrument
PS1 First sine-wave signal
PS2 Second sine-wave signal
TS Test signal
OUT Output signal

The invention claimed is:

1. A high-frequency measurement method for measuring an amplifier or a semiconductor amplifying element as a device under test, the high-frequency measurement method comprising:
    generating a test signal, the test signal being a sine-wave signal having a predetermined frequency, in which a period during which a power level is at a first power level whose length is equivalent to a period during which an input signal intended for the device under test is at the first power level, and a period during which the power level is at a second power level lower than the first power level are periodically repeated;
    inputting the test signal to the device under test as an input signal; and
    measuring a difference between an output signal of the device under test and an ideal value of the output signal;
    wherein the ideal value is generated based on the test signal.

2. The high-frequency measurement method according to claim 1, wherein the difference is a difference relating to a time response or a frequency response of the output signal.

3. The high-frequency measurement method according to claim 1, wherein the difference is a difference between the output signal and the ideal value relating to at least one of a power waveform, a waveform distortion, a phase rotation amount, and a transmission delay of the output signal.

4. The high-frequency measurement method according to claim 1, wherein the amplifier or the semiconductor amplifying element is composed of a compound semiconductor transistor.

5. A high-frequency measurement method for measuring a compound semiconductor transistor as a device under test, the high-frequency measurement method comprising:
    generating a test signal, the test signal being a sine-wave signal having a predetermined frequency, in which a period during which a power level is at a first power level whose length is equivalent to a period during which an input signal intended for the device under test is at the first power level, and a period during which the power level is at a second power level lower than the first power level are periodically repeated;
    inputting the test signal to the device under test as an input signal; and
    measuring, based on an output signal of the device under test, a transient response in gain variation of the device under test.

6. A high-frequency measurement apparatus comprising:
    a signal generator configured to output a test signal, the test signal being a sine-wave signal having a predetermined frequency, in which a period during which a power level is at a first power level whose length is equivalent to a period during which an input signal intended for the device under test is at the first power level, and a period during which the power level is at a second power level lower than the first power level are periodically repeated; and
    a measuring instrument configured to measure a difference between an output signal of a device under test and an ideal value of the output signal;
    wherein the ideal value is generated based on the test signal.

7. The high-frequency measurement apparatus according to claim 6, wherein
    the signal generator comprises:
    a first signal generator configured to output a first sine-wave signal having the first power level;
    a second signal generator configured to output a second sine-wave signal having the second power level; and
    a combiner configured to combine the first sine-wave signal and the second sine-wave signal to output the test signal.

* * * * *